United States Patent [19]

Pasternack et al.

[11] 3,932,346
[45] Jan. 13, 1976

[54] PIGMENTED PHOTOPOLYMERIZABLE COMPOUNDS STABILIZED AGAINST PREMATURE GELATION WITH THIOCARBAMATES

[75] Inventors: George Pasternack, Chicago; Thor Jondahl, Oak Park, both of Ill.

[73] Assignee: Continental Can Company, Inc., New York, N.Y.

[22] Filed: May 29, 1975

[21] Appl. No.: 582,000

Related U.S. Application Data

[63] Continuation-in-part of Ser. No. 452,227, March 18, 1974, abandoned.

[52] U.S. Cl. .................. 260/42.21; 260/45.75 R; 260/45.75 B; 260/45.75 C; 260/45.75 N; 260/45.8 N; 260/45.9 R
[51] Int. Cl.² ............................................. C08K 5/00
[58] Field of Search... 260/42.21, 45.75 R, 45.75 N, 260/45.75 C, 45.75 W, 45.75 V, 45.75 B, 45.9 R, 45.8 N

[56] References Cited
UNITED STATES PATENTS

| | | | |
|---|---|---|---|
| 2,993,789 | 7/1961 | Crawford | 260/45.9 X |
| 3,218,275 | 11/1965 | Geigle | 260/45.75 W X |
| 3,483,239 | 12/1969 | Hurlock et al. | 260/45.75 W X |

*Primary Examiner*—Lewis T. Jacobs
*Attorney, Agent, or Firm*—Paul Shapiro; Joseph E. Kerwin; William A. Dittmann

[57] ABSTRACT

Pigmented photopolymerizable ethylenically unsaturated ester compositions used as coatings and printing inks are stabilized to premature gelation by incorporating therein a stabilizing amount of a thiocarbamate compound having the formula

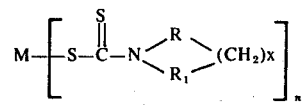

where M is 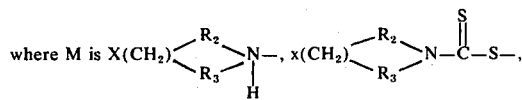

(NH₄⁺) or a or a metal cation having a valence of 1 to 3 and each of R, R₁, R₂, and R₃ (same or different) are hydrogen, aryl, saturated and unsaturated alkyl groups having 1 to 20 carbon atoms, aralkyl or alkaryl groups having 7 to 15 carbon atoms and amino, sulfo-and oxy-substituted alkyl and aryl groups, n is an integer of 1 to 3 and x is an integer from 0 to 1.

17 Claims, No Drawings

PIGMENTED PHOTOPOLYMERIZABLE COMPOUNDS STABILIZED AGAINST PREMATURE GELATION WITH THIOCARBAMATES

BACKGROUND OF THE INVENTION

1. Field of the Invention

This application is a continuation-in-part of Serial Number 452,227 filed March 18, 1974, now abandoned.

This invention relates to pigmented photopolymerizable compositions which are useful as coatings and printing inks and more particularly to pigmented photopolymerizable compositions which are stable to premature gelation.

2. The Prior Art

Printing inks and coatings prepared from photopolymerizable compounds are known to the art which can be polymerized and dried by exposure to ultraviolet radiation as for example, U.S. Pat. Nos. 2,453,769, 2,453,770, 3,013,895, 3,051,591, 3,326,710, 3,511,710 and 3,772,062.

These photopolymerizable inks and coatings are generally pigmented ethylenically unsaturated polyester compositions. When photoinitiators are incorporated in the composition, thin liquid films of the photopolymerizable composition can be cured to a hard film within 1 second or less using medium pressure mercury lamps.

The use of photopolymerizable inks and coatings eliminates the use of volatile organic solvents and the high cost and time of oven-baking which has heretofore been the conventional practice for drying and hardening inks and coatings.

In formulating inks using photopolymerizable unsaturated polyester vehicles, it was found that for some unexplainable reason, when the ester vehicles, which are normally stable to gelation at room temperature were pigmented with certain colorants, e.g. copper or nickel phthalocyanine pigments, the ester vehicle polymerized to form undesirable gels. The formation of gels in the ink or coating formulation substantially destroys the commercial utility of the material. Extending the time in which a pigmented composition will gel is important in commercial practice as several weeks storage is often required between formulation of the ink or pigmented coating and actual use of the material in printing and coating applications.

SUMMARY OF THE INVENTION

In accordance with the present invention there is provided photopolymerizable compositions which when pigmented with metal phthalocyanines exhibit improved stability to gel formation and which may be rapidly polymerized and hardened by exposure to a source of ultraviolet radiation, the compositions being comprised of an ethylenically unsaturated ester and a stabilizing amount of a thiocarbamate compound having the formula:

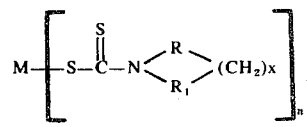

wherein M is

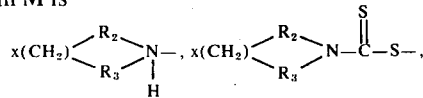

$(NH_4^+)$ or a metal cation having a valence of 1 to 3 and each of R, $R_1$, $R_2$, and $R_3$ (same or different) are hydrogen, aryl, saturated and unsaturated alkyl groups having 1 to 20 carbon atoms, aralkyl or alkaryl groups having 7 to 15 carbon atoms and amino, sulfo-and oxy-substituted alkyl and aryl groups, $n$ is an integer of 1 to 3 and $x$ is an integer from 0 to 1. Thus, the alkyl groups represented by R, $R_1$, $R_2$ and $R_3$ may be straight chain aliphatic groups, branched chained aliphatic groups and cyclic aliphatic groups or form hetero-cyclic ring structures with the nitrogen atom present in the thiocarbamate compound.

When thiocarbamate compounds of the type disclosed are incorporated in metal phthalocyanine pigmented ethylenically unsaturated esters in accordance with the practice of the present invention, the period of time during which the pigmented photopolymerizable ester will withstand gel formation is extended to commercially acceptable levels.

PREFERRED EMBODIMENTS

The term "ethylenically unsaturated ester compound" as used herein means, monohydric alcohol esters of $\alpha, \beta$ -ethylenically unsaturated acids, polyesters obtained by the reaction of an $\alpha, \beta$ -ethylenically unsaturated mono- or dibasic-acids with a polyhydric alcohol having 2 to 6 hydroxyl groups or a polyepoxide containing at least 2 reactive epoxy groups in the polyepoxide molecule and mixtures thereof.

Included within the meaning of $\alpha, \beta$ ethylenically unsaturated acid are unsaturated monocarboxylic acids having from 3 to 6 carbon atoms, e.g. acrylic acid, methacrylic acid, crotonic acid and sorbic acid and unsaturated dicarboxylic acids having 4 to 10 carbon atoms, e.g. maleic acid, tetrahydrophthalic acid, fumaric acid, glutaconic acid, itaconic acid and the like.

Illustrative of photopolymerizable ethylenically unsaturated polyesters useful in the practice of the present invention are acrylic acid and methacrylic acid esters of aliphatic polyhydric alcohols such as, for example, the di- and polyacrylates and the di- and polymethacrylates of ethylene glycol, polyalkylene glycols such as diethylene glycol, triethylene glycol, tetraethylene glycol, tetramethylene glycol, the corresponding ether glycols, triethylolethane, trimethylolpropane, pentaerythritol, dipentaerythritol and polypentaerythritols.

Typical unsaturated polyesters include, but are not limited to trimethylolpropane triacrylate, trimethylolethane triacrylate, triethylolpropane trimethacrylate, trimethylolethane trimethaacrylate, tetramethylene glycol dimethacrylate, ethylene glycol dimethacrylate, triethylene glycol dimethacrylate, tetraethylene glycol diacrylate, tetraethylene glycol dimethacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, pentaerythritol dimethacrylate, pentaerythritol trimethacrylate, and dipentaerythritol dimethacrylate.

A preferred class of ethylenically unsaturated polyester compounds useful in the practice of the present invention are the reaction products of a polyepoxide having at least two reactive groups in the polyepoxide molecule and an ethylenically unsaturated acid such as the $\alpha,\beta$-ethylenically unsaturated monocarboxylic acids having 3 to 6 carbon atoms and $\alpha,\beta$-ethylenically unsaturated dibasic acids having 4 to 10 carbon atoms previously discussed. These polyepoxide derived polyesters are well known to the art, e.g., U.S. Pat. No. 3,637,618, U.S. Pat. No. 3,408,422, U.S. Pat. No. 3,373,075, and Br. Pat. No. 1,241,851, the teachings of which are incorporated herein by reference.

Typical examples of polyepoxide compounds used for the preparation of ethylenically unsaturated polyesters preferred in the practice of the present invention include epoxidized polybutadiene (Oxiron 2001), epoxidized linseed oil (Epoxol 9-5), 1,4-butylene diglycidyl ether (RD-2), vinylcyclohexene di-epoxide (Epoxide 206) resorcinol diglycidyl ether (Kopoxite 159), Bisphenol A-diglycidyl ether (DER-332), s-tetraphenylethane tetra-glycidyl ether (Epon 1031), novalac resin polyglydicyl ether (DEN 438), dicyclopentadiene diepoxide (Epoxide 207) and dipentene dioxide.

Polyesters especially preferred in the practice of the present invention are polyesters prepared by reacting Bisphenol A-diglycidyl ether, i.e. the diglycidyl ether of 2,2-bis (4-hydroxyphenyl propane) with an ethylenically unsaturated monocarboxylic acid such as acrylic or methacrylic acid at a molar ratio of about 1:2 to prepare the diacrylate reaction product or with an ethylenically unsaturated dicarboxylic acid such as itaconic acid at equal molar ratios.

The bisphenol A-diglycidyl ether diacrylate may be blended with the bisphenol A-diglycidyl ether itaconate as well as other ethylenically unsaturated compounds and especially acrylate ester compounds to prepare photopolymerizable mixtures having the physical properties suitable for printing inks and coatings.

Examples of thiocarbamate compounds useful in the practice of the present invention include, tetramethylthiuram disulfide, tetraethylthiuram disulfide, tetrapropylthiuram disulfide, tetrabutylthiuram disulfide, tetradecylthiuram disulfide, tetrahexadecylthiuram disulfide, tetracicosylthiuram disulfide, 1-methyl-1-propyl-6-butyl-6-methyl thiuram di- sulfide, 1-propyl-1-butyl-6-methyl-6-t-butyl thiuram disulfide, dihexamethylene thiuram disulfide, dipentamethylene thiuram disulfide, piperdinium pentamethylene dithiocarbamate, piperdinium dibutyl dithiocarbamate, piperdinium dicyclohexyl dithiocarbamate, piperdinium di(3-oxycyclohexyl) dithiocarbamate, metal thiocarbamates as for example, nickel dipropyldithiocarbamate, nickel dibutyldithiocarbamate, nickel didecyldithiocarbamate, zinc dimethyldithiocarbamate, zinc dibutyldithiocarbamate, zinc dihexyldithiocarbamate, sodium dibutyl dithiocarbamate, zinc dimethyl dithiocarbamate, sodium dibutyldithiocarbamate, zinc diethyldithiocarbamate, zinc diamyldithiocarbamate, sodium dioctadecyldithiocarbamate, nickel diphenyldithiocarbamate, nickel dibenzyldithiocarbamate, nickel di(orthotolylaminoethyl) dithiocarbamate, zinc dicyclohexyldithiocarbamate, ammonium dipropyldithiocarbamate, potassium dihexyldithiocarbamate, calcium dihexyldithiocarbamate, zirconium diethyldithiocarbamate, cobalt dibutyldithiocarbamate, antimony dibutyldithiocarbamate, bismuth dimethyldithiocarbamate, lead dimethyldithiocarbamate, tin dibutyldithiocarbamate, nickel dicyclopentyldithiocarbamate, zinc 1-butyl-1-cylcohexyl-7-butyl-7-cyclohexyl dithiocarbamate, nickel di(3-oxacyclohexyl) dithiocarbamate, zinc di(4-oxacyclohexyl) dithiocarbamate, nickel di(3-thiocyclohexyl) dithiocarbamate, nickel di(4-azacyclohexyl) dithiocarbamate, zinc 1-butyl-1- (3-oxacyclohexyl)-7-butyl-7-(3-oxacyclohexyl) dithiocarbamate, nickel di(4-pyridyl) dithiocarbamate, zinc di (4-n,n-dimethyl anilino) dithiocarbamate, copper di(4-anisyl) dithiocarbamate, nickel di(4-thioanisyl) dithiocarbamate, and zinc di(3-furanyl) dithiocarbamate.

The thiocarbamate compounds may be incorporated in the photopolymerizable ester compositions at concentrations ranging from about 0.10 to about 1.0% by weight. Higher concentrations may be used if necessary, but concentrations substantially in excess of 1.0% by weight have been found to have a significant retarding effect on the speed at which the photopolymerizable composition will be cured by ultraviolet radiation.

Illustrative examples of phthalocyanine pigments useful as pigments for photopolymerizable ester based printing inks include copper phthalocyanine (Pigment Blue 15) copper polychlorophthalocyanine green and copper polybromochlorophthalocyanine.

Photoinitiators may be incorporated in the ester compositions used as vehicles for the photopolymerizable printing inks and coatings to accelerate the speed at which the inks and coatings harden. Illustrative examples of suitable photoinitiators include benzophenone, Mitchler's ketone (4,4-bis) (dimethylamino benzophenone) and mixtures thereof. The photoinitiators are incorporated in the photopolymerizable compositions at a concentration of 0.1 to 5% by weight.

In general, printing inks prepared using the pigmented photopolymerizable compositions of the present invention are prepared in the same manner as conventional printing inks. Generally, the printing inks contain about 30 to about 95 percent by weight of the photoinitiated photopolymerizable compositions and about 5 to 70 percent by weight of the pigment.

In printing metal surfaces with ultraviolet curable printing inks, the ink is applied using a printing press conventionally used for printing on a metal substrate. Once the metal substrate, generally in the form of a sheet is printed, the substrate is positioned to pass under a source of ultraviolet light to dry and harden the ink. In most instances, the ultraviolet light source is maintained at about 0.5 to about 5 inches from the printed substrate undergoing irradiation.

Rapid drying of the inks using the photoinitiated compositions of the present invention is effected within seconds of exposure to ultraviolet light emitted from an artificial source having a wave length in the range between 4000A and 1800A.

In the printing of metal coil stock for beverage container manufacture where extremely high speed drying of the ink (i.e. within one second) is required, mercury vapor discharge lamps, especially of the medium pressure type are used as a source of ultraviolet radiation. The output of commercially available medium pressure mercury vapor lamps varies between 100 to 200 watts per linear inch of lamp surface.

The present invention is illustrated by the Example which follows:

EXAMPLE

A photopolymerizable printing ink vehicle was prepared and consisted of 54.0 parts of the diacrylate reaction product of bisphenol A-diglycidyl ether and acrylic acid, 39.0 parts pentaerythritol tetraacrylate, 2.6 parts of an unsaturated polyester prepared by reacting equal molar amounts of itaconic acid and bisphenol A-diglycidyl ether, 3.0 parts of tetraethylene glycol diacrylate, 0.8 parts Mitchler's ketone and 0.6 parts benzophenone.

To determine the stability of the ink vehicle to gel formation when metal phthalocyanine pigments were incorporated therein the following test procedure was utilized.

ample, a number of known stabilizer compounds as well as compounds closely related to the compounds used in the present invention, but outside the scope of the invention, were incorporated in the pigmented ink vehicle and these comparison ink compositions were also tested for gel stability. The results of these comparative tests, designated by the symbol "C", are also summarized in Tables I and II. Also tests in which no stabilizer compounds were incorporated in the pigmented ink vehicle were also run and are also designated by the symbol "C" in the Tables.

TABLE I

| Test No. | Stabilizer | Concentration Wt. % | Gellation Time (Minutes) | | | |
|---|---|---|---|---|---|---|
| | | | 40 | 80 | 100 | 110 |
| 1 | Zinc dibutyldithiocarbamate | 0.25 | | | Gel | |
| 2 | Zinc dibutyldithiocarbamate | 1.0 | | | | Gel |
| 3 | Nickel dibutyldithiocarbamate | 0.5 | | Gel | | |
| 4 | Nickel dibutyldithiocarbamate | 1.0 | | | Gel | |
| 5 | Tetraethylthiuram disulfide | 0.25 | | Gel | | |
| 6 | Tetraethylthiuram disulfide | 1.0 | | | Gel | |
| 7 | Sodium N,N-diethyldithiocarbamate | 1.0 | | | | Gel |
| 8 | Piperidinium pentamethylene dithiocarbamate | 1.0 | | Gel | | |
| 9 | 1-Pyrrolidenecarbodithioc acid ammonium salt | 0.25 | | Gel | | |
| 10 | 1-Pyrrolidenecarbodithioc acid ammonium salt | 1.0 | | Gel | | |
| $C_1$ | None | 0 | Gel | | | |
| $C_2$ | p-Methoxyphenol | 1.0 | Gel | | | |
| $C_3$ | p-methoxyphenol | 2.0 | Gel | | | |
| $C_4$ | 2,6-Di-tert.-butyl-4-methylphenol | 1.0 | Gel | | | |
| $C_5$ | 2,6-Di-tert.-butyl-4-methylphenol | 2.0 | Gel | | | |
| $C_6$ | 1,1,3,3-tetraethyl-2-thiourea | 1.0 | Gel | | | |
| $C_7$ | N,N-Dimethylthioformamide | 1.0 | Gel | | | |
| $C_8$ | Zinc isopropyl xanthate | 1.0 | Gel | | | |

TABLE II

| Test No. | Stabilizer | Concentration Wt. % | Pigment | Gellation Time (Minutes) | | |
|---|---|---|---|---|---|---|
| | | | | 20 | 40 | 60 |
| 11 | Zinc dibutyl dithiocarbamate | 1.0 | CPG | | | Gel |
| $C_9$ | 2,6-di-t-butyl-4-methylphenol | 1.0 | CPG | | Gel | |
| $C_{10}$ | 2,-6-di-t-butyl-4-methylphenol | 2.0 | CPG | | Gel | |
| $C_{11}$ | None | 0 | CPG | | Gel | |
| 12 | Zinc dibutyldithiocarbamate | 0.25 | NPB | | | Gel |
| 13 | Nickel dibutyldithiocarbamate | 0.25 | NPB | | Gel | |
| $C_{12}$ | None | 0 | NPB | Gel | | |

Into a two ounce glass jar was placed 17.43 grams of the photopolymerizable ink vehicle just described as well as 2.4 grams of a metal phthalocyanine pigment and 0.25–1.0% by weight based on the ink vehicle of a thiocarbamate compound dissolved in 1.5 grams methyl ethyl ketone. The mixture was then stirred using a high speed air motor (60 psi) until the pigment was uniformly distributed in the ink vehicle. The pigmented sample was placed in an oven heated to 325°F and monitored every 20 minutes for the appearance of gel material in the jar. By this test unpigmented vehicle gels in 80 minutes.

A series of storage stability tests were run using varying concentrations of different thiocarbamate compounds. The results of these accelerated gel stability tests are recorded in Tables I and II below.

In Table I, the pigment incorporated in the vehicle was copper phthalocyanine blue pigment. In Table II, copper polychlorophthalocyanine green pigment designated "CPG" and nickel phthalocyanine blue designated "NPB", were used as the pigments. The appearance of a gel in the test jars is designated by the term "Gel".

For purposes of comparison, in a separate series of tests run in accordance with the procedure of the Ex- The data in the Tables indicate that metal phthalocyanine pigmented photopolymerizable compositions stabilized in accordance with the practice of the present invention exhibit superior storage stability when compared to pigmented photopolymerizable compositions stabilized with compounds outside the scope of the invention.

Pigmented photopolymerizable compositions composed of 12 percent by weight copper phthalocyanine blue pigment and 88 percent by weight of an ink vehicle composed of composition number 1 of Table I were applied to steel plate of the type used in the manufacture of steel beverage containers using a number 10 draw bar which evenly distributed the compositions as a thin film on the plate.

After application of the stabilized pigmented photopolymerizable compositions, the coated plates were placed under a medium pressure mercury lamp at a distance of about 1.0 inches from the lamp surface.

The radiation emitted by the lamp was approximately 200 watts/in. of lamp surface. The coated plates when exposed to the ultraviolet radiation dried in 0.6 seconds.

What is claimed is:

1. A photopolymerizable composition stabilized to gel formation comprised of a metal phthalocyanine pigmented ethylenically unsaturated ester and a stabilizing amount of a thiocarbamate compound having the formula

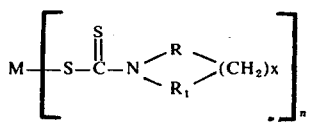

wherein M is selected from the group consisting of

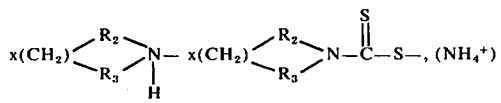

and a metal cation having a valence of 1 to 3 and each of R, $R_1$, $R_2$ and $R_3$ are selected from the group consisting of hydrogen, aryl, alkyl groups having 1 to 20 carbon atoms, aralkyl and alkaryl groups having 7 to 15 carbon atoms and amino-, sulfo-and oxy-substituted alkyl and aryl groups, $n$ is an integer of 1 to 3 and $x$ is an integer of 0 to 1.

2. The composition of claim 1 wherein the thiocarbamate compound is zinc dibutyldithiocarbamate.

3. The composition of claim 1 wherein the thiocarbamate compound is nickel dibutyldithiocarbamate.

4. The composition of claim 1 wherein the thiocarbamate compound is tetraethylthiuram disulfide.

5. The composition of claim 1 wherein the thiocarbamate compound is sodium N,N-diethyldithiocarbamate.

6. The composition of claim 1 wherein the thiocarbamate compound is piperidinium pentamethylene dithiocarbamate.

7. The composition of claim 1 wherein the thiocarbamate is 1-pyrrolidenecarbodithioc acid ammonium salt.

8. The composition of claim 7 wherein the ethylenically unsaturated ester is the reaction product of a polyepoxide having at least two reactive groups in the polyepoxide molecule and an acid selected from the group consisting of $\alpha$, $\beta$-ethylenically unsaturated monocarboxylic acids having 3 to 6 carbon atoms and $\alpha$, $\beta$-ethylenically unsaturated dibasic acids having 4 to 1 carbon atoms.

9. The composition of claim 7 wherein the unsaturated compound is the reaction product of a polyhydric alcohol having 2 to 6 carbon atoms and an acid selected from the group consisting of $\alpha$, $\beta$-ethylenically unsaturated monocarboxylic acids having 3 to 6 carbon atoms and $\alpha$, $\beta$-ethylenically unsaturated dibasic acids having 4 to 10 carbon atoms.

10. The composition of claim 8 wherein the polyepoxide is the diglycidyl ether of bisphenol A.

11. The composition of claim 8 wherein the acid is acrylic acid.

12. The composition of claim 8 wherein the acid is itaconic acid.

13. The composition of claim 9 wherein the alcohol is pentaerythritol.

14. The composition of claim 9 wherein the alcohol is polyethylene glycol.

15. The composition of claim 1 wherein the thiocarbamate compound is incorporated in the unsaturated ester at a concentration at about 0.10 to about 1.0 percent by weight.

16. The composition of claim 1 wherein the metal phthalocyanine pigment incorporated in the unsaturated ester is a copper phthalocyanine pigment.

17. The composition of claim 1 wherein the metal phthalocyanine pigment incorporated in the unsaturated ester is a nickel phthalocyanine pigment.

* * * * *